(12) United States Patent
Mueller-Mach et al.

(10) Patent No.: US 6,501,102 B2
(45) Date of Patent: *Dec. 31, 2002

(54) LIGHT EMITTING DIODE (LED) DEVICE THAT PRODUCES WHITE LIGHT BY PERFORMING PHOSPHOR CONVERSION ON ALL OF THE PRIMARY RADIATION EMITTED BY THE LIGHT EMITTING STRUCTURE OF THE LED DEVICE

(75) Inventors: Regina B. Mueller-Mach, San Jose, CA (US); Gerd O. Mueller, San Jose, CA (US); George M. Craford, Los Altos Hills, CA (US)

(73) Assignee: LumiLeds Lighting, U.S., LLC, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/941,452

(22) Filed: Aug. 28, 2001

(65) Prior Publication Data

US 2002/0003233 A1 Jan. 10, 2002

Related U.S. Application Data

(63) Continuation-in-part of application No. 09/407,228, filed on Sep. 27, 1999, now abandoned.

(51) Int. Cl.$^7$ .............................................. H01L 27/15
(52) U.S. Cl. ............................ 257/84; 257/14; 257/15; 257/18; 257/20; 257/22; 257/94; 257/95; 257/96; 257/98; 257/103; 313/463; 313/467; 313/468; 313/473; 313/501; 313/502
(58) Field of Search .............................. 257/14, 15, 18, 257/20, 22, 94, 95, 96, 98, 103; 313/463, 467, 468, 473, 501, 502, 505

(56) References Cited

U.S. PATENT DOCUMENTS 4,230,510 A * 10/1980 Cusano et al. ................ 156/67

5,496,597 A 3/1996 Soininen et al. ............. 927/584

(List continued on next page.)

FOREIGN PATENT DOCUMENTS

| DE | 298 04 149 | 6/1998 | ........... H01L/33/00 |
| EP | 1017111 A2 | 7/1997 | ........... H01L/33/00 |

(List continued on next page.)

OTHER PUBLICATIONS

Phosphor Handbook, by Shionoya and Yen, published by CRC Press, 1999 (English Version), p. 111.*
Guha, S. et al.: "Hybrid organic–inorganic semiconductor –based light–emitting diodes" Journal of Applied Physics, 1997, vol. 82, No. 8, pp. 4126–4128, XP000752425, ISSN: 0021–8979.

(List continued on next page.)

*Primary Examiner*—Olik Chaudhuri
*Assistant Examiner*—Wai-Sing Louie
(74) *Attorney, Agent, or Firm*—Skjerven Morrill LLP; Norman R. Klivans (57) ABSTRACT

Presented is an LED device that produces white light by performing phosphor conversion on substantially all of the primary light emitted by the light emitting structure of the LED device. The LED device comprises a light emitting structure and at least one phosphor-converting element located to receive and absorb substantially all of the primary light. The phosphor-converting element emits secondary light at second and third wavelengths that combine to produce white light. Some embodiments include an additional phosphor-converting element, which receives light from a phosphor-converting element and emits light at a fourth wavelength. In the embodiments including an additional phosphor-converting element, the second, third, and fourth wavelengths combine to produce white light. Each phosphor-converting element includes at least one host material doped with at least one dopant. The phosphor-converting element may be a phosphor thin film, a substrate for the light emitting structure, or a phosphor powder layer.

27 Claims, 4 Drawing Sheets

U.S. PATENT DOCUMENTS

| | | | |
|---|---|---|---|
| 5,502,737 A | * 3/1996 | Chartier et al. | 372/11 |
| 5,813,753 A | 9/1998 | Vriens et al. | 362/293 |
| 5,847,507 A | * 12/1998 | Butterworth et al. | 313/512 |
| 5,939,825 A | 8/1999 | Sun et al. | 313/503 |
| 5,957,560 A | 9/1999 | Do et al. | 353/88 |
| 5,959,316 A | 9/1999 | Lowery | 257/98 |
| 5,998,925 A | 12/1999 | Shimizu et al. | 313/503 |
| 6,066,861 A | 5/2000 | Holn et al. | 857/99 |
| 6,086,673 A | 7/2000 | Molnar | 117/90 |
| 6,212,213 B1 | 4/2001 | Weber et al. | 372/50 |
| 6,252,254 B1 | * 6/2001 | Soules et al. | 257/89 |
| 6,273,589 B1 | 8/2001 | Weber et al. | 362/293 |
| 6,294,800 B1 | * 9/2001 | Duggal et al. | 257/89 |

FOREIGN PATENT DOCUMENTS

| | | | | |
|---|---|---|---|---|
| EP | WO 00/33389 | 6/2000 | ........... | H01L/33/00 |
| EP | WO 00/33390 | 6/2000 | ........... | H01L/33/00 |
| JP | 10 012916 | 1/1998 | ........... | H01L/33/00 |
| JP | 10 056203 | 2/1998 | ........... | H01L/33/00 |
| WO | WO 97/50132 | 12/1997 | ........... | H01L/33/00 |
| WO | WO 98/39805 | 9/1998 | ........... | H01L/33/00 |
| WO | WO 99/02026 | 1/1999 | ............. | H01J/1/62 |
| WO | WO 00/33389 | 6/2000 | | |
| WO | WO 00/33390 | 6/2000 | | |

OTHER PUBLICATIONS

Hide, F. et al.: "White light from InGaN/conjugated polymer hybrid light–emitting diodes" Applied Physics Letters, 1997, vol. 70, No. 20, May 19, 1997, pp. 2664–2666, XP000694783, ISSN: 0003–6951.

Niko, A. et al.: "White light and red–green–blue (RGB)electroluminescence by light color–conversion" Optical Materials, vol. 9, No. 1–4, 1998, pp. 188–191, XP004123023, ISSN: 0925–3467.

Sato, Y. et al.: "Full–Color Fluorescent Display Devices Using a Near–UV Light–Emitting Diode" Japanese Journal of Applied Physics, 1996, vol. 35, No. 7A, pp. L838–L839, XP000733074, ISSN: 0021–4922.

* cited by examiner

LIGHT EMITTING DIODE (LED) DEVICE THAT PRODUCES WHITE LIGHT BY PERFORMING PHOSPHOR CONVERSION ON ALL OF THE PRIMARY RADIATION EMITTED BY THE LIGHT EMITTING STRUCTURE OF THE LED DEVICE

RELATED APPLICATION

This application is a Continuation-In-Part of U.S. patent application Ser. No. 09/407,228 filed on Sep. 27, 1999, now abandoned, which is herein incorporated by reference in its entirety.

TECHNICAL FIELD OF THE INVENTION

The present invention relates to light emitting diode (LED) devices and, more particularly, to an LED device that performs phosphor conversion on all of the primary radiation emitted by the light emitting structure of the LED device to produce white light.

BACKGROUND OF THE INVENTION

With the development of efficient LED devices that emit bluish or ultraviolet (UV) light, it has become feasible to produce LED devices that generate white light through phosphor conversion of a portion of the primary radiation emission of the light emitting structure of the LED device to longer wavelengths. Conversion of primary emission to longer wavelengths is commonly referred to as down-conversion of the primary emission. An unconverted portion of the primary emission combines with the light of longer wavelength to produce white light. LED devices that produce white light through phosphor conversion are useful for signaling and illumination purposes. LED devices having light emitting structures that emit white light directly currently do not exist.

Currently, state-of-the-art phosphor conversion of a portion of the primary emission of the LED devices is attained by placing phosphors in an epoxy that is used to fill a reflector cup, which houses the LED device within the LED lamp. The phosphor is comprised as a powder that is mixed into the epoxy prior to curing the epoxy. The uncured epoxy slurry containing the phosphor powder is then deposited onto the LED device and is subsequently cured.

The phosphor particles within the cured epoxy generally are randomly oriented and interspersed throughout the epoxy. A portion of the primary light emitted by the LED device passes through the epoxy without impinging on the phosphor particles, whereas a portion of the primary light emitted by the LED device impinges on the phosphor particles, thereby causing the phosphor particles to emit yellowish light. The combination of the primary bluish light and the phosphor-emitted yellowish light produces white light.

One disadvantage of using phosphor-converting epoxy in this manner is that uniformity in the white light emitted by the LED device is difficult, if not impossible, to obtain. This non-uniformity is caused by non-uniformity in the sizes of the phosphor particles mixed into the epoxy slurry. Currently, phosphor powders having uniform phosphor particle sizes generally are not available. When the phosphor powder is mixed into the epoxy slurry, the larger phosphor particles sink faster than the smaller phosphor particles. This non-uniformity in spatial distribution of the phosphor particles exists in the epoxy once it has been cured.

Therefore, obtaining a uniform distribution of the phosphor particles within the epoxy is very difficult, if not impossible, due to the non-uniformity of the sizes of the phosphor particles. This inability to control the sizes of the phosphor particles and their locations within the epoxy results in difficulties in controlling the fraction of the primary light that is summed with the phosphor-emitted yellowish light to produce white light.

Since this fraction cannot be precisely controlled, the quality of the white light produced by LED lamps may vary from one lamp to another, even for a given model manufactured by a particular manufacturer. Another disadvantage of this type of LED device is that the light emitting structure of the LED device is most efficient at emitting bluish light in the range of about 450 nanometers (nm) to about 500 nm. There is reason to believe that LED devices may be developed in the future that will operate efficiently at shorter wavelengths, e.g., between about 400 and 450 nm. It would be desirable to provide an LED device that is capable of producing primary light at these shorter wavelengths and of performing phosphor conversion on the primary light to produce white light. However, mixing primary light of wavelengths below 460 nm with the phosphor-converted emission will not produce white light due to the fact that the wavelengths of the primary emission are hardly visible.

Accordingly, a need exists for an LED device that is capable of producing high quality white light through phosphor conversion of all of the primary light, and that is capable of being reproduced in such a manner that the quality and uniformity of the white light generated by the LED devices is predictable and controllable.

SUMMARY OF THE INVENTION

The present invention provides an LED device that is capable of performing phosphor conversion on substantially all of the primary light emitted by the light emitting structure of the LED device to produce white light. The LED device comprises at least one phosphor-converting element located to receive and absorb substantially all of the primary light emitted by the light-emitting structure. The phosphor-converting element emits secondary light at second and third wavelengths that combine to produce white light. Typically, the second wavelength is greater than the first wavelength and the third wavelength is greater than the second wavelength. Secondary light at additional wavelengths may also be emitted by the phosphor-converting element. These additional wavelengths would also combine with the light of the second and third wavelengths to produce white light.

The phosphor-converting element generates the secondary light at the third wavelength in response to excitation by the primary light and/or the secondary light at the second wavelength. The excitation by the secondary light at the second wavelength is effected by macroscopic absorption and/or quantum-mechanical transfer. The phosphor-converting element includes either (a) a first host material doped with a first dopant and a second host material doped with a second dopant, which may or may not be the same as the first dopant, or (b) a host material doped with a first dopant and a second dopant. The first dopant emits the secondary light at the second wavelength and the second dopant emits the secondary light at the third wavelength. Furthermore, additional host materials and/or additional dopants that emit additional wavelengths of secondary light may be incorporated into the phosphor-converting element. These additional wavelengths of secondary light would be emitted by the phosphor-converting element in response to excitation by secondary light of the second or third wavelengths, or in response to excitation by the secondary light of one or more of the additional wavelengths. Secondary light of these wavelengths would then combine to create white light.

In accordance with an alternative embodiment, the light generated by the phosphor-converting element includes light of at least one additional wavelength, which is generated in response to excitation by (a) the primary light and/or (b) the secondary light at any wavelength shorter than the additional wavelength. The phosphor-converting element generates the secondary light at the additional wavelength in response to excitation by (a) the primary light at the first wavelength, (b) the secondary light at the second wavelength, and/or (c) the secondary light at the third wavelength. Excitation by the secondary light occurs by (a) macroscopic absorption and/or (b) quantum-mechanical transfer. The secondary light of the second, third and the additional wavelengths combines to produce white light.

The present invention is not limited with respect to the types of phosphor-converting elements that are utilized in the LED device, or with respect to the composition of the phosphor-converting elements. The host material includes a phosphor compound that is capable of incorporating an atomically-dispersed dopant. The dopant must have a particular chemical relationship to the host that makes it suitable for being incorporated into the host. The host materials comprising the phosphor-converting elements may be, for example, phosphor-converting powders in an encapsulant (e.g., epoxy), phosphor-converting organic dyes, phosphor-converting substrates, phosphor-converting thin films, closely-packed phosphor powder layers, etc. Also, various combinations of these host materials and/or of the phosphor-converting elements can be created. In one case, an epoxy encapsulant is mixed with a phosphor powder. The phosphor-converting element may comprise a second host material that is a phosphor-converting thin film. In all cases, all of the primary light will be absorbed by one or more of the phosphor-converting elements such that virtually no primary light is left unused.

Other features and advantages of the present invention and variations thereof will become apparent from the following description, drawings and claims.

DETAILED DESCRIPTION OF THE INVENTION

Figure 1:
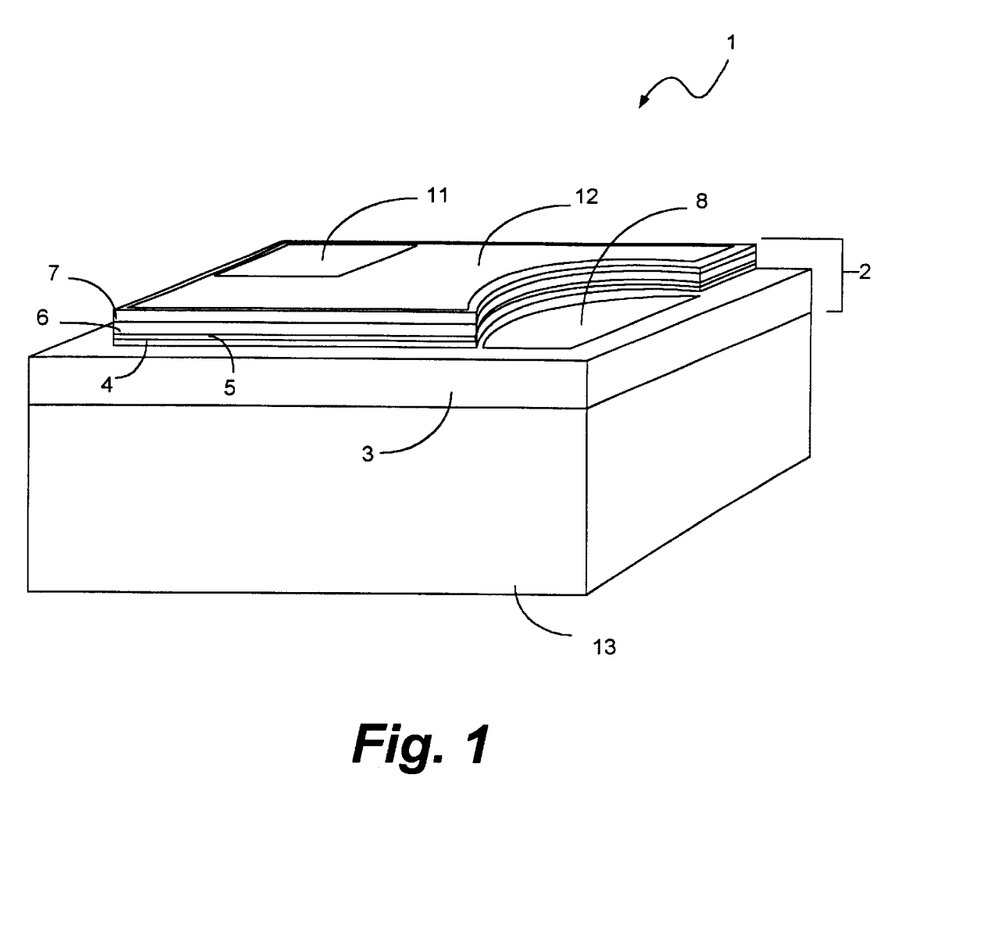
FIG. 1 is a perspective view of the light emitting diode device that is suitable for use with the present invention.

FIG. 1 is a perspective view of a light emitting diode (LED) 1 that is suitable for use with the present invention. However, it should be noted that the LED of the present invention is not limited to any particular LED. Those skilled in the art will understand that a variety of LED designs are suitable for use with the present invention.

For purposes of describing the typical components of the LED 1, the LED 1 has been shown without any phosphor-converting elements disposed thereon. The phosphor-converting elements of the present invention include, but are not limited to, phosphor-converting dyes, phosphor-converting powders in an encapsulant, phosphor-converting thin films, phosphor-converting substrates, as discussed below in more detail. Those skilled in the art will understand, in view of the discussion provided herein, how any of these types of phosphor-converting elements may be used to achieve the goals of the present invention. The phosphor-converting elements perform phosphor conversion by either macroscopic absorption or by quantum-mechanical transfer, both of which are know in the art. Quantum-mechanical transfer occurs between dopants that are not more than about 6 nanometers (nm) apart. Therefore, phosphor conversion via quantum-mechanical transfer will only happen under certain circumstances.

The LED 1 may comprise, for example, a light emitting structure 2, which comprises two n-GaN layers 3 and 4, an SQW or MQW GaInN layer 5, a p-AlGaN layer 6 and a p-GaN layer 7. The light emitting structure 2 also comprises an n-electrode bond pad 8, an n-electrode 3, a p-electrode bond pad 11 and a p-electrode 12. The n-electrode 3 is comprised of GaN and the p-electrode 12 is a light transmitting and current spreading material comprised of Ni/Au. The electrode bond pads 8 and 11, when connected to a voltage supply (not shown), provide the biasing current for causing the LED 1 to emit light.

The light emitting structure 2 is disposed on a substrate 13. The substrate material used will depend on the types of phosphor-converting elements incorporated into the LED device and on the manner in which the layers of the LED device are arranged with respect to one another. The manner in which a suitable substrate material is chosen will be discussed below in detail. As stated above, the light emitting diode device 1 is not limited to any particular type of light emitting diode device, with the exception that the light emitting diode device utilized in accordance with the present invention emits a primary light that is either bluish or ultraviolet (UV) and has a wavelength that is equal to or less than 460 nm, and preferably is equal to or less than 440 nm. Those skilled in the art will understand that various light emitting diodes are known that are capable of emitting light of this wavelength.

The light emitting structure 2 that generates the bluish or UV primary emissions may be grown epitaxially on the substrate of the LED device 1. In some cases, the substrate material may be transmissive, whereas in other cases it may be opaque, as described below in detail. Those skilled in the art will understand that a plurality of substrate materials are suitable for these purposes.

Figure 2:
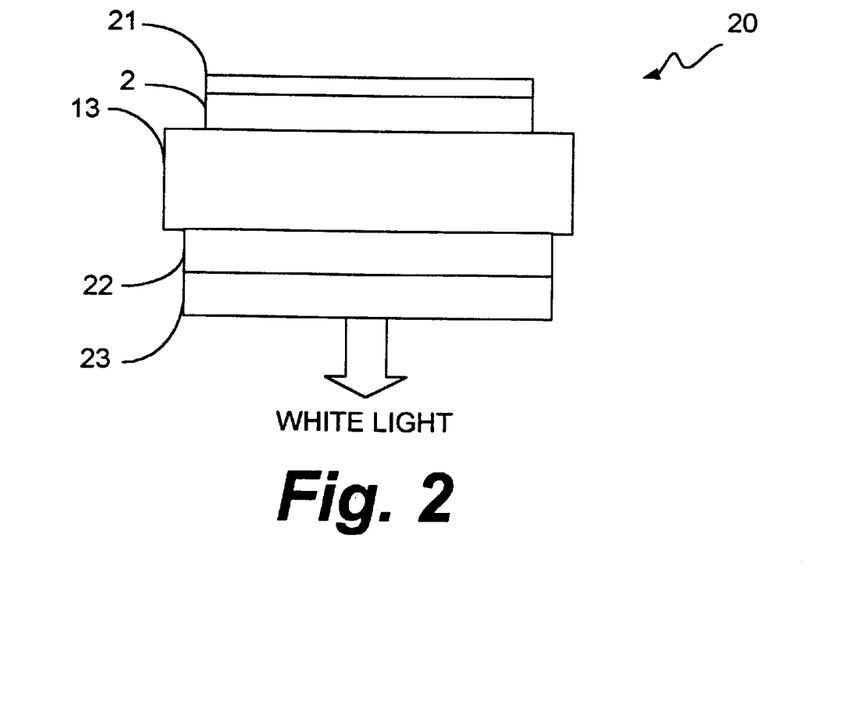
FIG. 2 is a side view of the light emitting diode device of the present invention in accordance with a first exemplary embodiment wherein two phosphor thin films are utilized to perform the phosphor conversion necessary to produce white light.

FIG. 2 is a side view of the LED device of the present invention in accordance with a first exemplary embodiment. The LED device 20 comprises a substrate 13, which is transparent or transmissive, and a light emitting structure 2, which is disposed on a surface of substrate 13. In accordance with this embodiment, the LED device 20 comprises two phosphor layers 22 and 23. Phosphor layer 22 is disposed on the surface of the substrate 13. Phosphor layer 23 is disposed on top of phosphor layer 22. A reflective electrode 21 preferably is disposed on the surface of the light emitting structure 2.

During operation, light emitting structure 2 generates primary bluish light or ultraviolet (UV) emission of wavelengths equal to or shorter than about 460 nm. The primary emission propagates through substrate 13 and impinges on phosphor layer 22. Phosphor layer 22 absorbs some or all of the primary light impinging thereon to bluish light of a longer wavelength than the primary light. This longer-wavelength bluish light may have a wavelength between about 460–510 nm. The excitation of phosphor layer 22 that produces the bluish light of the longer wavelength is effected by macroscopic absorption. The longer-wavelength bluish light is emitted by phosphor layer 22. Some of the longer-wavelength bluish light emitted by phosphor layer 22 passes through phosphor layer 23 without exciting the dopants in phosphor layer 23. The rest of the bluish light emitted by phosphor layer 22 excites the dopants in phosphor layer 23, which then emits yellowish light having a wavelength of about 550 nm–580 nm. Any primary light that was not absorbed by phosphor layer 22 is absorbed by phosphor layer 23, which then emits yellowish light. The yellowish light emitted by phosphor layer 23 combines with the longer-wavelength bluish light emitted by phosphor layer 22 to produce white light. "White light," as used herein, refers to light including mixed wavelengths that appears substantially white to an average human eye.

It should be noted that the primary light may comprise light having more than one wavelength. Similarly, the light emitted in response to excitation by the primary light may comprise light of more than one wavelength. For example, the bluish light emitted by phosphor layer 22 may correspond to a plurality of wavelengths making up a spectral band. Likewise, the yellowish light emitted by phosphor layer 23 may correspond to a plurality of wavelengths making up a different spectral band. Wavelengths of both of these spectral bands may then combine to produce white light. Therefore, although individual wavelengths are discussed herein for purposes of explaining the concepts of the present invention, it will be understood that the excitation being discussed herein may result in a plurality of wavelengths, or a spectral band, being emitted. Wavelengths of the spectral bands may then combine to produce white light. Therefore, the term "spectral band" is intended to denote a band of at least one wavelength and of potentially many wavelengths, and the term "wavelength" is intended to denote the wavelength of the peak intensity of a spectral band. All primary wavelengths and wavelengths that result from conversion by a phosphor layer provided herein are peak wavelengths with a halfwidth of about 20–150 nm.

For good color rendering, i.e., in order to produce high quality white light, the bluish light that is combined in the final summation to produce white light should include bluish light of wavelengths shorter than about 480 nm. Since the primary light is converted into light of a longer wavelength than the primary light, the light emitting structure 2 should emit primary light at wavelengths shorter than about 460 nm. However, those skilled in the art will understand that the present invention is not limited to emitting primary light at wavelengths below 460 nm, but that it is preferable to do so in order to achieve all of the goals of the present invention, which include producing white light of the highest quality. Of course, high quality color rendering is not the only goal of the present invention. Other factors, such as design flexibility, costs, efficiency, etc., should be taken into account in designing and creating the LED device of the present invention.

In one example of the embodiment shown in FIG. 2, each of phosphor layers 22 and 23 is a phosphor thin film. A person of ordinary skill in the art would know to adjust the thickness of phosphor thin films 22 and 23 to achieve the desired combination of colors. Phosphor thin films may be deposited by a plurality of known methods. Phosphor thin films have been used primarily in the thin film electroluminescent display industry. Therefore, the manner in which phosphor thin films can be deposited is well known. Several known techniques may be used for depositing the phosphor thin films such as, for example, electron beam evaporation, thermal evaporation, RF-sputtering, chemical vapor deposition and atomic layer epitaxy. The method that is utilized for depositing the thin film may depend on the desired characteristics of the thin film. For example, if the thin film is to absorb all of the primary radiation emitted by the LED, one particular deposition technique may be used, whereas if the thin film is to allow a percentage of the primary radiation to pass through it, a different technique may be used. Those skilled in the art will understand which type of technique is to be utilized in order to obtain a thin film having the desired characteristics.

Preferably, the method for depositing the phosphor thin films is RF-sputtering. In accordance with this method, phosphor powder is pressed into a target of a diameter slightly exceeding the LED wafer diameter such that homogenous coverage is ensured. As will be understood by those skilled in the art, the sputter gas characteristics can vary, but preferably the sputter gas is Argon and comprises about 1% to about 3% of oxygen, and the pressure and RF power input are matched to give optimum thickness and homogeneity. The distance between the target and the substrate preferably is about 5 to 10 cm. For the embodiments disclosed herein, phosphor thin films may have a thickness between about 5 $\mu$m and about 70 $\mu$m. The phosphor powder may be a Yttrium-Aluminum-Garnet ("YAG") compound doped with a lanthanide ion, such as $Y_3Al_5O_{12}:Ce^{3+}$, $Y_3Al_5O_{12}:Ho^{3+}$, and $Y_3Al_5O_{12}:Pr^{3+}$. Yttrium may be partly replaced lanthanide element, such as in $(Y_{0.75}Gd_{0.25})$ $AG:Ce^{3+}$. Alternatively, the phosphor powder may be $SrGa_2S_4$ or SrS doped with a lanthanide ion (e.g., $SrGa_2S_4:Eu^{2+}$ or $SrS:Eu^{2+}$) or Nitridosilicates doped with $Eu^{2+}$. The phosphor thin film may be, for example, closest-packed. Those skilled in the art will understand that the present invention is not limited to using any particular type of phosphor for this purpose. A plurality of different types of phosphors exist that are suitable for this purpose.

Although the amount and the spatial distribution of dopants can be varied, a typical dopant concentration of the present invention lies between about 0.01 mol % and about 5 mol %. The fraction of the primary radiation that passes through each of the phosphor thin films without being absorbed is determined by the dopant concentrations of the phosphor thin films. Therefore, the characteristics of the white light produced by the light emitting diode device 20 can be ensured. Thus, manufacturing uncertainties can be eliminated and LED devices having high quality and consistency can be obtained.

The homogeneity of the phosphor thin films can be further improved by rotating the LED wafer on a particular trajectory, such as on eccentric circles, or more complicated trajectories. This technique of rotating the wafer to improve the homogeneity of a material is known in the art. Since the manner in which phosphor thin films having a desired homogeneity can be created and deposited is known, in the interest of brevity, no further discussion of the manner in which this is accomplished will be provided herein.

Figure 3:
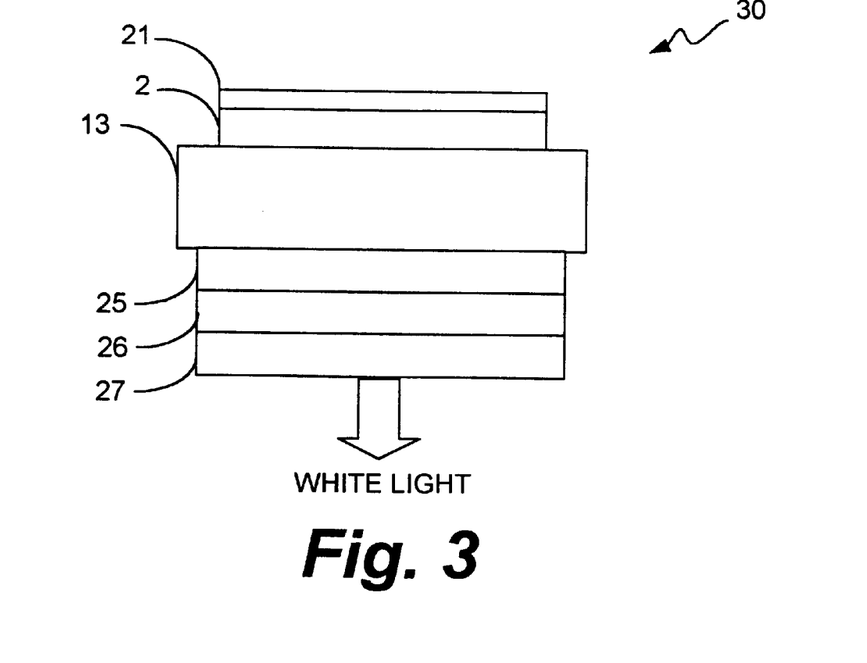
FIG. 3 is a side view of the light emitting diode device of the present invention in accordance with a second exemplary embodiment wherein three phosphor thin films are utilized to perform the phosphor conversion necessary to produce white light.

FIG. 3 is a side view of the light emitting diode device 30 of the present invention in accordance with a second embodiment. The LED device 30 is very similar to LED device 20 shown in FIG. 2, with the exception that the LED device 30 comprises three phosphor layers 25, 26 and 27 that function in a slightly different manner than phosphor layers 22 and 23 shown in FIG. 2. In the embodiment shown in FIG. 3, phosphor thin films 25, 26 and 27 generate bluish, greenish and reddish light, respectively.

The primary light emitted by light emitting structure 2 propagates through substrate 13 and impinges on phosphor layer 25. Phosphor layer 25 absorbs at least some of the primary light and emits the longer-wavelength bluish light. A portion of the longer-wavelength bluish light emitted by phosphor layer 25 passes through phosphor layer 26 without being absorbed. Phosphor layer 26 absorbs the remaining primary light and maybe some of the longer-wavelength bluish light, and emits greenish light. The longer-wavelength bluish light that is not absorbed by phosphor layer 26 and the greenish light emitted by phosphor layer 26 impinge on phosphor layer 27. Phosphor layer 27 may become excited by longer-wavelength bluish light or greenish light, and emit reddish light. Therefore, phosphor layer 27 effectively converts either a fraction of the longer-wavelength bluish light emitted by phosphor layer 25 or a fraction of the greenish light emitted by phosphor layer 26 into reddish light. Unabsorbed longer-wavelength bluish light and unabsorbed greenish light pass through phosphor layer 27 and combine with the reddish light to produce white light.

In this embodiment, the primary light emitted by light emitting structure 2 has a wavelength of about 450 nm. The longer-wavelength bluish light emitted by phosphor thin film 25 has a wavelength of about 480–510 nm. The greenish light emitted by phosphor thin film 26 has a wavelength of about 525–580 nm. The reddish light emitted by phosphor thin film 27 has a wavelength of about 610–630 nm.

In one example of the embodiment in FIG. 3, each of phosphor layers 25, 26, and 27 is a phosphor thin film of thickness about 5–25 $\mu$m, and LED device 1 includes an InGaN light emitting structure 2 having a reflective p-electrode 21. Phosphor thin film 25 may contain $SrGa_2S_4:Ce^{3+}$ and have a thickness of about 8 $\mu$m. Phosphor thin film 26 may contain $SrGa_2S_4:Ce^{3+}$ and have a thickness of about 12 $\mu$m. Phosphor thin film 27 may contain $SrS:Eu^{2+}$ and have a thickness of about 22 $\mu$m. The primary light, which has a wavelength of about 390 nm, passes through transparent substrate 13 and impinges on phosphor thin film 25. Phosphor thin film 25 absorbs at least part of the impinging primary light to exit a longer-wavelength bluish light having a peak of about 450–490 nm. Some of the longer-wavelength bluish light is absorbed, and the remainder impinges on phosphor thin film 26 along with any remaining primary light. Phosphor thin film 26 absorbs the remaining primary light and maybe some of the longer-wavelength bluish light, and emits a greenish light having a peak wavelength of about 525–555 nm. The longer-wavelength bluish light that passes through phosphor thin film 26 without being absorbed and the greenish light impinge on phosphor thin film 27. Phosphor thin film 27 absorbs part of the impinging light and emits reddish light having a wavelength of about 610–630 nm. The longer-wavelength bluish light, the greenish light, and the reddish light combine to form white light.

In another example of the embodiment in FIG. 3, each of phosphor layers 25, 26, and 27 is a phosphor-containing resin layer. The same phosphor particles as in the above example may be used, suspended in the resin in powder form. Three layers, each layer containing one type of phosphor, may be used. Alternatively, one layer containing a mixture of different types of phosphor may be used. An exemplary resin composition is provided in U.S. Pat. No. 6,066,861 to Hohn et al titled "Wavelength-Converting Casting Composition and Its Use," which is herein incorporated by reference.

Figure 4:
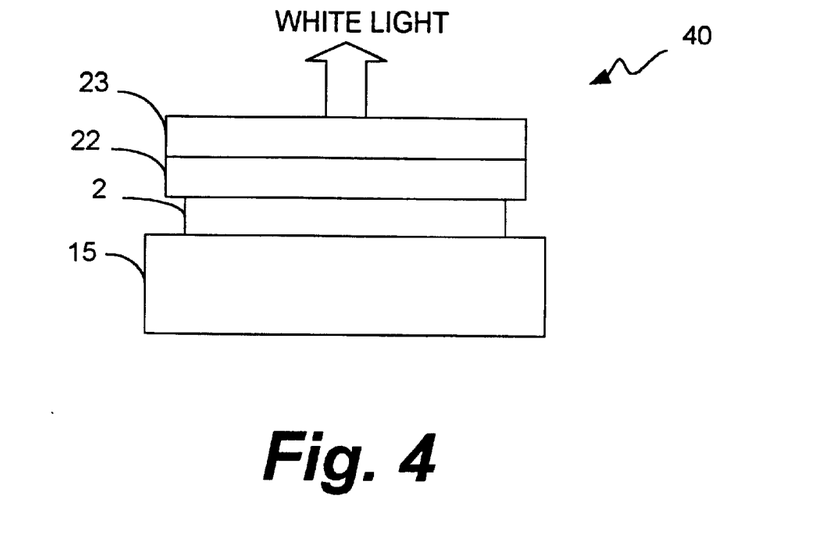
FIG. 4 is a side view of a third exemplary embodiment of the light emitting diode device of the present invention, which corresponds to one possible modification of the light emitting diode device shown in FIG. 2.

FIG. 4 is a side view of a third embodiment of the present invention, which corresponds to a modification of the embodiment shown in FIG. 2. The reflective electrode 21 shown in FIG. 2 is not incorporated into LED device 40 shown in FIG. 4. The substrate 15 may be, for example, Silicon Carbide (SiC) or a form of Aluminum Oxide ($Al_2O_3$) known as sapphire. Phosphor layer 22 is disposed on a surface of the light emitting structure. Phosphor layer 23 is disposed on phosphor layer 22. LED device 40 operates in essentially the same manner in which LED device 20 operates to produce white light. The primary light emitted by the light emitting structure 2 impinges on phosphor layer 22. Phosphor layer 22 absorbs some or all of the primary light impinging thereon and emits a longer-wavelength bluish light having a wavelength that is longer than the wavelength of the primary light. Some of the longer-wavelength bluish light emitted by phosphor layer 22 passes through phosphor layer 23 without exciting the phosphor, and the rest of the longer-wavelength bluish light excites the phosphor of phosphor layer 23. Phosphor layer 23, when excited, emits yellowish light. Any primary light that impinges on phosphor layer 23 also excites the phosphor, causing phosphor layer 23 to emit yellowish light. The yellowish light emitted from phosphor layer 23 combines with the unabsorbed longer-wavelength bluish light emitted by phosphor layer 22 to produce white light. Phosphor layers 22 and 23 absorb substantially all of the primary light.

Figure 5:
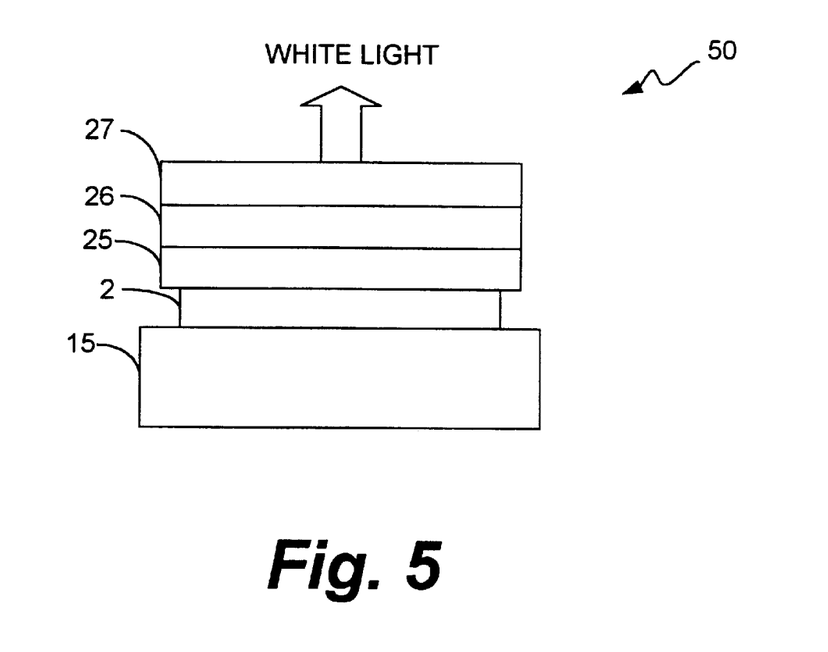
FIG. 5 is a side view of a fourth exemplary embodiment of the light emitting diode device of the present invention, which corresponds to one possible modification of the light emitting diode device shown in FIG. 3.

FIG. 5 is a side view of a fourth exemplary embodiment of the present invention, which corresponds to a modification of the embodiment shown in FIG. 3. The reflective electrode 21 shown in FIG. 3 is not incorporated into LED device 50 shown in FIG. 5. Substrate 15 may be identical to the substrate shown in FIG. 4. Phosphor layer 25 is disposed on a surface of light emitting structure 2. Phosphor layer 26 is disposed on phosphor layer 25 and phosphor layer 27 is disposed on phosphor layer 26. LED device 50 operates in essentially the same manner in which LED device 30 shown in FIG. 3 operates.

The primary light emitted by the light emitting structure 2 impinges on phosphor layer 25, which absorbs some or all of the primary light and emits bluish light of a longer wavelength than the wavelength of the primary light. The longer-wavelength bluish light then impinges on phosphor layer 26, which converts a portion of the longer-wavelength bluish light into greenish light. A portion of the longer-wavelength bluish light emitted by phosphor layer 25 passes through phosphor layer 26 without being absorbed. Phosphor thin film 26 may absorb any remaining primary light. At least one of the longer-wavelength bluish light emitted by phosphor layer 25 and the greenish light emitted by phosphor layer 26 is then absorbed and emitted as reddish light by phosphor layer 27. Fractions of longer-wavelength bluish light and greenish light pass through thin film 27 and combine with the emitted reddish light to produce white light. Primary light is not part of the final combination that produces white light. All of the primary light is absorbed or used to excite the dopants.

Figure 6:
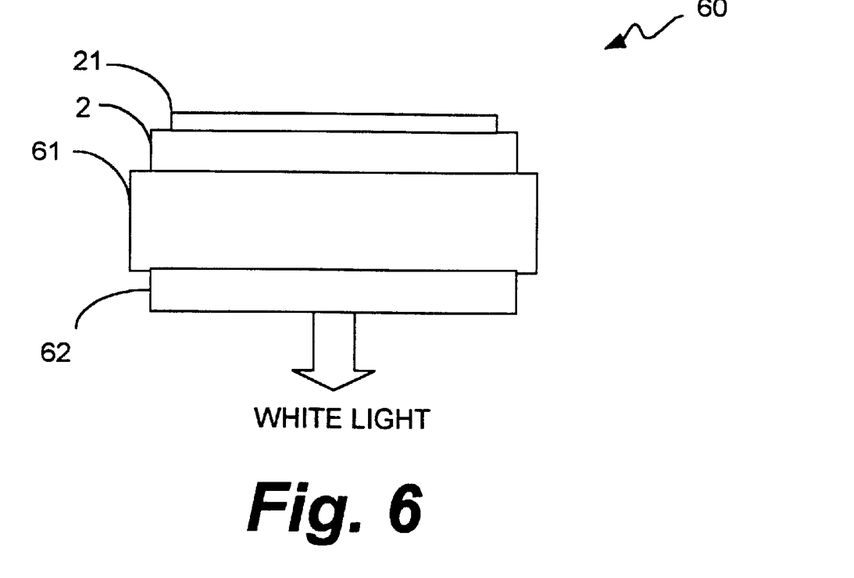
FIG. 6 is a side view of the light emitting diode device of the present invention in accordance with a fifth exemplary embodiment wherein a phosphor-converting substrate is utilized in conjunction with a phosphor thin film to perform the phosphor conversion necessary to produce white light.

FIG. 6 is a side view of the light emitting diode device 60 of the present invention in accordance with a fifth exemplary embodiment. In this embodiment, light emitting structure 2 is disposed on a substrate 61, which acts as both a substrate and a phosphor layer. A reflective electrode 21, which may be identical to the reflective electrode 21 shown in FIGS. 2 and 3, is disposed on a surface of light emitting structure 2. A single phosphor layer 62 is disposed on a surface of substrate 61. Phosphor layer 62 may be, for example, a phosphor thin film deposited in the manner described above.

Light emitting structure 2 preferably is grown epitaxially on the single crystal phosphor substrate 61. The substrate 61 preferably is a single crystal Cerium-doped Yttrium-Aluminum-Garnet ($Y_3Al_5O_{12}:Ce^{3+}$) compound. Substrates such as Aluminum Oxide are typically used in LED devices because they have desirable thermal, mechanical and crystalline structure properties. Although Aluminum Oxide has the thermal, mechanical and crystalline structure properties that are needed for a suitable substrate, the lattice structure of this compound is too dense to allow it to be doped with rare earth ions, such as $Ce^{3+}$, in sufficient concentrations to enable it to perform phosphor conversion.

In accordance with the present invention, it has been determined through research and experimentation that a single crystal Yttrium-Aluminum-Garnet ($Y_3Al_5O_{12}$), commonly referred to as "YAG", also has the thermal, mechanical and crystalline structure properties that make it suitable for use as the substrate of an LED device. Since it is known that YAG can be doped with Cerium to produce a yellowish-light-emitting phosphor, it has been determined, in accordance with the present invention, that a single crystal Cerium-doped YAG compound ($Y_3Al_5O_{12}:Ce^{3+}$) can serve the dual purpose of providing all of the necessary functions of an LED device substrate and of generating phosphor-converted emissions. Substrate 61 could also include Yttrium-Aluminum-Oxides which do not have garnet structures, such as monoklinic YalO and YalO-perovskite. Several lanthanides (Ln) may partly replace the Yttrium, such as in (Y,Ln)AlO, (Y,Ln)(Al,Ga)O. The lanthanide may be, for example Lutethium (Lu).

Substrate 61 may be doped with single dopants such as Cerium (Ce), Praseodymium (Pr), Holmium (Ho), Ytterbium (Yb), and Europium (Eu), or with double dopants such as (Ce,Pr), (Ce, Ho), and (Eu,Pr). $Y_3Al_5O_{12}:Ho^{3+}$, and $Pr^{3+}$ are examples of single crystal substrates that may be suitable for substrate 61.

In one embodiment, the substrate 61 emits yellowish light in response to receiving the primary light generated by light emitting structure 2. The primary light is either bluish light or ultraviolet light having a wavelength that is shorter than or equal to about 460 nm. Some or all of the primary light generated by light emitting structure 2 that propagates into substrate 61 is absorbed and emitted as yellowish light. The unabsorbed primary light impinges on phosphor layer 62, which absorbs the primary light and emits a bluish light of a wavelength greater than 460 nm. The yellowish light emitted by substrate 61 then combines with the bluish light to produce white light.

In one example of the embodiment in FIG. 6, substrate 61 is a YAG substrate doped with 4 mol % Cerium ($Ce^{3+}$) and light emitting structure 2 is designed to emit primarily light having a wavelength of about 410–460 nm. Substrate 61, which may be about 0.2–0.4 mm thick, absorbs some of the primary light and emits yellowish light having a peak wavelength of about 550–570 nm. Phosphor layer 62, which may be a phosphor thin film, absorbs any remaining primary light and emits bluish light. This bluish light combines with the yellowish light from substrate 61 to produce white light.

Part of the Yttrium in YAG may be substituted by a lanthanide element such as Gadolinium (Gd). For example, substrate 61 may include ($Y_{0.75} Gd_{0.25}$) AG:Ce. Using ($Y_{0.75} Gd_{0.25}$) AG:Ce shifts the peak wavelength of the emission from phosphor layer 62 to about 575 nm. A person of ordinary skill in the art would know how to adjust phosphor layer 2 to optimize the white light that is produced.

The fraction of light absorbed by substrate 61 and phosphor layer 62 may be controlled through the doping process. This allows the quality of the white light produced by the LED device 60 to be predicted and controlled, which, in turn, eliminates manufacturing uncertainties and ensures that variations in the quality of the white light produced are minimized or eliminated.

The thickness and doping of substrate 61 are tailored in such a manner that substrate 61 transmits a predetermined amount of primary light needed for excitation of phosphor layer 62. Those skilled in the art will understand the manner in which substrate 61 can be tailored to achieve the desired conversion. Typically, the wavelength of the light emitted by light emitting structure 2 should be equal to or greater than about 400 nm because substrate 61 is not as readily excited by light of shorter wavelengths. However, substrates made of material that is excitable at wavelengths beyond this range may also be suitable for use with the present invention.

Figure 7:
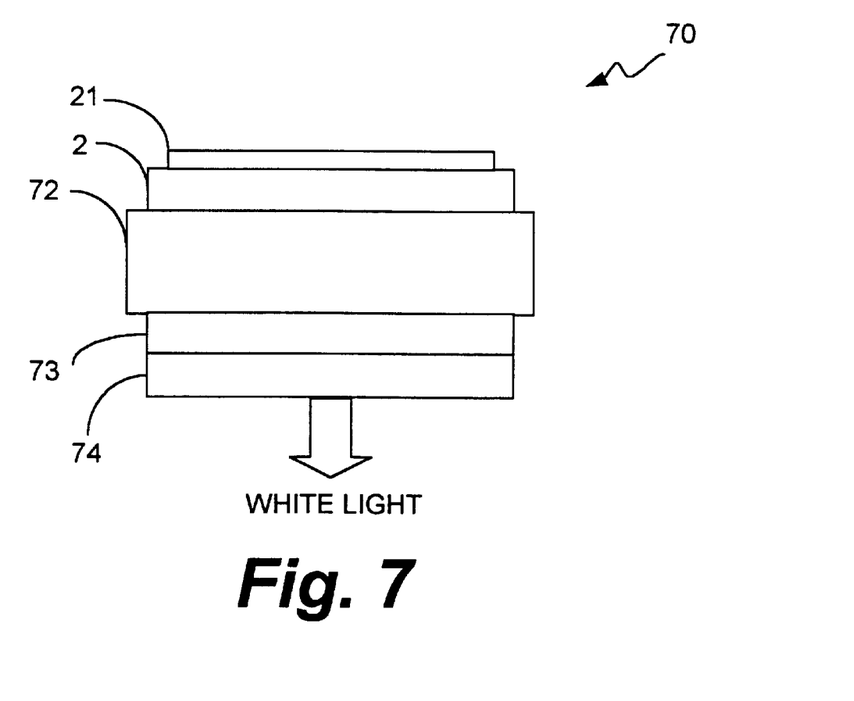
FIG. 7 is a side view of the light emitting diode device of the present invention in accordance with a sixth exemplary embodiment wherein a phosphor-converting substrate is utilized in conjunction with two phosphor thin films to perform the phosphor conversion necessary to produce white light.

FIG. 7 is a side view of the LED device of the present invention in accordance with a seventh exemplary embodiment. The LED device 70 comprises substrate 72, light emitting structure 2 disposed on a surface of substrate 72, reflective electrode 21 disposed on a surface of light emitting structure 2, and two phosphor layers 73 and 74 overlaying each other and disposed on a surface of substrate 72. Phosphor layers 73 and 74 may be, for example, phosphor thin films 73 and 74 deposited in the manner discussed above in reference to FIG. 2.

As stated above, the primary light is either bluish light or ultraviolet light having a wavelength that is proximately equal to or less than 450 nm. Some or all of the primary light that propagates into substrate 72 is absorbed and emitted as bluish light having a wavelength that is longer than the wavelength of the primary light. The longer-wavelength bluish light emitted by substrate 72 impinges on phosphor layer 73, which absorbs a portion of the longer-wavelength bluish light and emits greenish light. Phosphor layer 73 may also absorb some or all of any remaining primary light and emit greenish light.

A portion of the longer-wavelength bluish light emitted by substrate 72 propagates through phosphor layer 73 without being absorbed. The greenish light and the unabsorbed longer-wavelength bluish light impinge on phosphor layer 74. Phosphor layer 74 may be designed to become excited by light having the wavelength range of the unabsorbed bluish light or the wavelength range of the greenish light. A portion of the greenish and bluish light propagates through phosphor layer 74 without being absorbed. Any remaining primary light is converted by phosphor layer 74 into reddish light. A portion of either the bluish light emitted by substrate 72 or the greenish light emitted by phosphor layer 73 will be converted by phosphor layer 74 into reddish light. The reddish light combines with the bluish light and greenish light to produce white light. Details on using YAG as substrate are provided in U.S. patent application Ser. No. 09/407,231, which is herein incorporated by reference.

It should be noted that all of the embodiments discussed above provide LED devices that are capable of producing high quality white light with predictability and controllability, even with primary emissions of relatively short wavelengths. It should be noted that although it has been stated herein that the wavelength of the primary emission is less than or equal to about 450 nm, and preferably is less than or equal to 440 nm, the LED devices of the present invention are not limited to any particular wavelengths. Those skilled in the art will also understand that the present invention is not limited to the embodiments explicitly discussed herein. For example, although various phosphor-converting substrates were discussed above, these substrates may also be viewed as thick films. Therefore, the LED device of the present invention may comprise a typical substrate, such as a Silicon Carbide or sapphire substrate, which provides the typical functionality of an LED substrate, and one or more phosphor-converting thick films having the phosphor-converting properties of the substrates discussed above and shown in FIGS. 6 and 7.

Such thick films may also be used in place of the phosphor thin films in some or all cases. Of course, using thick films instead of thin films may increase the overall dimensions of the LED device. Also, the ordering of the phosphor-converting elements within the LED device may be different from that shown in FIGS. 2–7, as will be understood by those skilled in the art. Therefore, the order in which the phosphor-converting elements appear in the figures should be viewed as exemplary and/or as the preferred ordering. Persons skilled in the art will understand that other variations and modifications may be made to the embodiments discussed above that are also within the scope of the present invention.

What is claimed is:

1. A light emitting device for generating white light, the light emitting device comprising:

a light emitting structure that emits primary light of a first wavelength when driven, said first wavelength being shorter than about 460 nm; and a phosphor-converting element located to receive and absorb substantially all of said primary light emitted by said light emitting structure, said phosphor-converting element emitting secondary light at second and third wavelengths that combine to produce white light, said phosphor-converting element generating said secondary light and said third wavelength in response to excitation by at least one of said primary light and said secondary light at said second wavelength, said phosphor-converting element comprising at least one host material doped with at least one dopant, and said white light appearing substantially white to an average human eye; and wherein said at least one host material comprises at least one of a Yttrium-Aluminum-Oxide compound, $SrGa_2S_4$, a Yttrium-Aluminum-Lanthanide-Oxide compound, a Yttrium-Aluminum-Lanthanide-Gallium-Oxide compound, SrS and a Nitridosilicate.

2. The light emitting device of claim 1, wherein said at least one dopant is selected from a group consisting of Cerium, Europium, Holmium, Ytterbium, and Praseodymium.

3. The light emitting device of claim 1, wherein concentration of each of said at least one dopant is between about 0.01 mol % and about 5 mol %.

4. The light emitting device of claim 1, wherein said at least one host material comprises one of a substrate for said light emitting structure, a phosphor thin film, a phosphor powder, and a phosphor-converting dye.

5. The light emitting device of claim 1, wherein said phosphor-converting element comprises a substrate for said light emitting structure and said substrate comprises a Yttritum-Aluminum-Oxide compound.

6. The light emitting device of claim 5, wherein said substrate has a thickness between about 0.2 mm and about 0.4 mm, said light emitting structure emitting a peak wavelength of about 410–460 nm and a dopant in said YAG substrate emits a peak of about 550–570 nm.

7. The light emitting device of claim 5, wherein said substrate comprises a $(Y_{0.75}Gd_{0.25})AG$ substrate having a thickness between about 0.2 mm and about 0.4 mm, said light emitting structure emitting a peak wavelength of about 410–460 nm and a dopant in said YAG substrate emits a peak of about 575 nm.

8. The light emitting device of claim 1, wherein said phosphor-converting element is a first phosphor-converting element, further comprising a second phosphor-converting element, said second phosphor-converting element comprising at least one additional host material doped with at least one additional dopant, said at least one additional dopant emitting light at a fourth wavelength, said light at said fourth wavelength being emitted in response to excitation by at least one of (a) said primary light, (b) said secondary light at said second wavelength and (c) said secondary light at the third wavelength.

9. The light emitting device of claim 8, wherein said at least one additional host material comprises at least one of a Yttrium-Aluminum-Oxide compound, $SrGa_2S_4$, a Yttrium-Aluminum-Lanthanide-Oxide compound, a Yttrium-Aluminum-Lanthanide-Gallium-Oxide compound, a Nitridosilicate, and SrS.

10. The light emitting device of claim 8, wherein said at least one additional dopant is selected from a group consisting of Cerium, Europium, Holmium, Ytterbium, and Praseodymium.

11. The light emitting device of claim 8, wherein concentration of each of said at least one additional dopant is between about 0.01 mol % and about 5 mol %.

12. The light emitting device of claim 8, wherein said second phosphor-converting element comprises one of a substrate for said light emitting structure, a phosphor thin film, a phosphor powder mixed in with an epoxy, and a phosphor-converting dye.

13. The light emitting device of claim 8, further comprising a light-transmissive substrate located between said light emitting structure and said phosphor-converting element.

14. The light emitting device of claim 8, wherein said first phosphor-converting element comprises a first host material doped with a first dopant and a second host material doped with a second dopant and said second phosphor-converting element comprises a third host material doped with a third dopant, wherein said second wavelength has a peak at about 480–510 nm, said third wavelength has a peak at about 525–580 nm, and said fourth wavelength has a peak at about 610–630 nm, each of said wavelengths having a halfwidth between about 20–150 nm.

15. The light emitting device of claim 8, wherein said first phosphor-converting element comprises a first host material doped with a first dopant and a second host material doped with a second dopant, wherein each of said first host material doped with said first dopant and said second host material doped with said second dopant comprises $SrGa_2S_4$ doped with Cerium ($SrGa_2S_4:Ce^{3+}$) and each of said at least one additional host material doped with at least one additional dopant comprises SrS doped with Europium ($SrS:Eu^{2+}$).

16. The light emitting device of claim 15, wherein said first and second phosphor-converting elements comprise multiple layers of phosphor thin films, each phosphor thin film having a thickness of about 5–25 $\mu$m.

17. The light emitting device of claim 15, wherein said primary light has a peak wavelength shorter than or about equal to 400 nm, said second wavelength has a peak at about 450–490 nm, said third wavelength has a peak at about 525–555 nm, and said fourth wavelength has a peak at about 610–630 nm, each of said wavelengths having a halfwidth between about 20 nm and about 150 nm.

18. The light emitting device of claim 1, wherein said at least one host material and at least one dopant comprises a first host material doped with a first dopant and a second host material doped with a second dopant, said first dopant emitting said secondary light at said second wavelength and said second dopant emitting said secondary light at said third wavelength.

19. The light emitting device of claim 18, wherein the light of the second wavelength is bluish having a wavelength between about 460 nm and about 510 nm and wherein the light of said third wavelength is yellowish having a wavelength between about 550 nm and about 580 nm, the light of said second and third wavelengths combining to form white light.

20. The light emitting device of claim 18, wherein each of said first and second host materials has a thickness of about 5–70 $\mu$m.

21. The light emitting device of claim 18, further comprising a light-transmissive substrate, said light-transmissive substrate being located between said light emitting structure and said phosphor-converting element.

22. The light emitting device of claim 21, further comprising a reflective electrode disposed on a surface of said light emitting structure, said reflective electrode reflecting a portion of said primary light toward said light-transmissive substrate.

23. The light emitting device of claim 18, wherein said first and second host materials comprise first and second phosphor thin films, respectively, said first phosphor thin film being disposed on a surface of a substrate and said second phosphor thin film being disposed on said first phosphor thin film.

24. The light emitting device of claim 1, wherein said phosphor-converting element comprises one host material doped with a first dopant and a second dopant wherein said first dopant emits said secondary light at said second wavelength and said second dopant emits said secondary light at said third wavelength.

25. The light emitting device of claim 24, wherein said one host material is a Yttrium-Aluminum-Oxide substrate and said first dopant and said second dopant are selected from a group consisting of Cerium, Europium, Holmium, Ytterbium, and Praseodymium.

26. The light emitting diode device of claim 1, wherein said first wavelength corresponds to a peak wavelength of a first spectral band, said second wavelength corresponds to a peak wavelength of a second spectral band, and said third wavelength corresponds to a peak wavelength of a third spectral band.

27. The light emitting device of claim 1, further comprising a substrate for said light emitting structure, said substrate being located so that said light emitting structure is between said substrate and said phosphor-converting element.

* * * * *